United States Patent [19]
Lee

[11] Patent Number: 5,943,261
[45] Date of Patent: Aug. 24, 1999

[54] METHOD FOR PROGRAMMING A FLASH MEMORY

[75] Inventor: William W. Y. Lee, Palo Alto, Calif.

[73] Assignee: Winbond Electronics Corporation, Hsinchu, Taiwan

[21] Appl. No.: 09/130,889

[22] Filed: Aug. 7, 1998

[51] Int. Cl.⁶ ................................................. G11C 16/04
[52] U.S. Cl. ............................. 365/185.14; 365/185.28; 365/185.33
[58] Field of Search ......................... 365/185.14, 185.18, 365/185.26, 185.28, 185.33

[56] References Cited

U.S. PATENT DOCUMENTS 5,488,586  1/1996  Madurawe et al. ...................... 365/218
5,715,194  2/1998  Hu ....................................... 365/185.17

*Primary Examiner*—David Nelms
*Assistant Examiner*—David Lam
*Attorney, Agent, or Firm*—Townsend & Townsend & Crew LLP

[57] ABSTRACT

A method of programming a flash memory device. The method includes a step of applying a voltage that is less than a threshold voltage to a select gate of a flash memory device. Electrons are transferred from a source/drain region or preferably the source region through a region underlying the select gate to a channel region underlying a floating gate. The transferring step occurs using an electron gradient from a higher concentration region in the source region to a lower concentration region in the channel region. By way of a selected voltage applied to a control gate, one of a plurality of selected voltage levels are applied to the floating gate.

7 Claims, 9 Drawing Sheets

METHOD FOR PROGRAMMING A FLASH MEMORY

BACKGROUND OF THE INVENTION

The present invention relates to semiconductor integrated circuits and their manufacture. The invention is illustrated in an example with regard to the manufacture of a "flash" electrically-erasable programmable read only memory ("Flash EEPROM") cell, but it will be recognized that the invention has a wider range of applicability. Merely by way of example, the invention may be applied in the manufacture of other semiconductor devices such as micro controllers, microprocessors, application specific integrated circuits, embedded memory applications, among others. The present invention can also be applied in programming a variety of other types of integrated circuits such as CMOS logic or the like.

Industry has used or proposed a variety of memory devices. An example of such a memory device is an erasable programmable read-only memory ("EPROM") device. The EPROM device is readable, writable, and erasable, i.e., programmable. The EPROM is implemented using a floating gate field effect transistor, which has certain binary states. That is, a binary state is represented by the presence or absence of charge on the floating gate. The charge is generally sufficient to prevent conduction even when a normal high signal is applied to the gate of the EPROM transistor.

A wide variety of EPROMs is available. In a traditional form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate where charge is accumulated.

Another form of EPROM is the electrically erasable programmable read-only memory ("EEPROM" or "E²PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

Flash memory cells, however, are often bulky and difficult to fabricate in a desired space due to complex geometries of the multiple gate layers used to form the control and floating gates. Accordingly, flash memory cells generally cannot be integrated as tightly or closely as other types of memory devices such as DRAMs, for example. Additionally, flash memory cells often require a high gate coupling ratio to achieve desirable programmability and functionality. High gate coupling ratios are often achieved by way of increasing the surface area of the control gate relative to the floating gate while reducing the surface area of the floating gate that is coupled to the channel region of the memory cell. Unfortunately, it is often difficult to increase the gate coupling ratio without significantly increasing the size of the memory cell. Furthermore, conventional flash memory cells are often limited to programming the cell to binary states, i.e., one or zero. Although certain devices may claim to have more than binary states, numerous limitations still exist. Accordingly, conventional flash memory cells have many limitations.

From the above it is seen that a flash memory cell structure that is relatively easy to fabricate, cost effective, and reliable is clearly desired.

SUMMARY OF THE INVENTION

According to the present invention, a technique including a method and device for the fabrication of an integrated circuit such as a flash memory cell is provided. In an exemplary embodiment, the present invention also provides a method of programming a flash memory device for multi-level programming use, i.e., more than two states.

In a specific embodiment, the present invention provides a novel multi-level memory cell for a flash memory device. The memory cell has a variety of features such as a semiconductor substrate and a floating gate layer (e.g., poly-1) defined overlying the semiconductor substrate. A select gate layer (e.g., poly-2) is defined adjacent to an edge of the floating gate layer. The select gate is defined as a sidewall spacer of conductive material that is insulated from the floating gate layer. A thick dielectric layer (e.g., oxide) is overlying the select gate layer. A control gate layer is overlying the select gate layer and the floating gate layer, where the control gate layer is insulated from the select gate layer by the thick dielectric layer.

To program the present device, the select gate layer selectively provides one of a plurality of voltages to be applied to the floating gate layer. That is, a voltage level applied on the select gate layer allows electrons to migrate from the source region to a region underlying the select gate, where the region underlying the select gate is not inverted, i.e., the voltage level on the select gate layer is below the threshold voltage needed to invert the region. Electrons traverse through the channel region by way of an electron gradient between the source region and the channel region. The electrons inject into the floating gate by way of voltage applied to the control gate layer. The electrons cease injecting into the floating gate layer once the amount of electrons become "saturated," which is a function of the voltage on the control gate. The saturated floating gate layer provides a resulting floating gate voltage level that corresponds to one of a plurality of voltages or programming states, which provides for multi-level programming operation.

In an alternative embodiment, the present invention provides a method of programming a flash memory device. The method includes a step of applying a voltage that is less than a threshold voltage to a select gate of a flash memory device. Electrons are transferred from a first region (e.g., source/drain) region or preferably the source region through a region underlying the select gate to a channel region underlying a floating gate. The transferring step occurs using an electron gradient from a higher concentration region in the region underlying the select gate to a lower concentration region in the channel region. Electrons inject into the floating gate by way of a selected voltage applied a control gate. By way of the voltage applied to the control gate, one of a plurality of selected voltage levels are applied to the floating gate.

Numerous benefits are achieved by way of the present cell design over conventional devices. In a specific embodiment, the present invention provides a novel device that uses source-side injection for programming a floating gate. By way of selected voltages, the invention uses a self-limiting point of a floating gate that should be relatively insensitive to programming time or duration. Additionally, single cell addressing is achieved in some embodiments. Programming speed is generally enhanced by way of the present invention. Programming speed is also adjustable by way of voltages applied to the select and control gates. The present invention also provides for a higher programming efficiency than conventional devices. In some embodiments, programming efficiency is improved by a magnitude of two orders or greater. Control over programming is also provided. That is, programming can be independent of time in some embodiments, but based substantially upon a control gate programming voltage level. The present invention achieves one or more of these benefits in one or more embodiments. These and other benefits, however, will be discussed in more detail below.

The present invention achieves these benefits in the context of known process technology. However, a further understanding of the nature and advantages of the present invention may be realized by reference to the latter portions of the specification and attached drawings.

DETAILED DESCRIPTION OF THE SPECIFIC EMBODIMENTS

Conventional Flash EEPROM Structures

Figure 1:
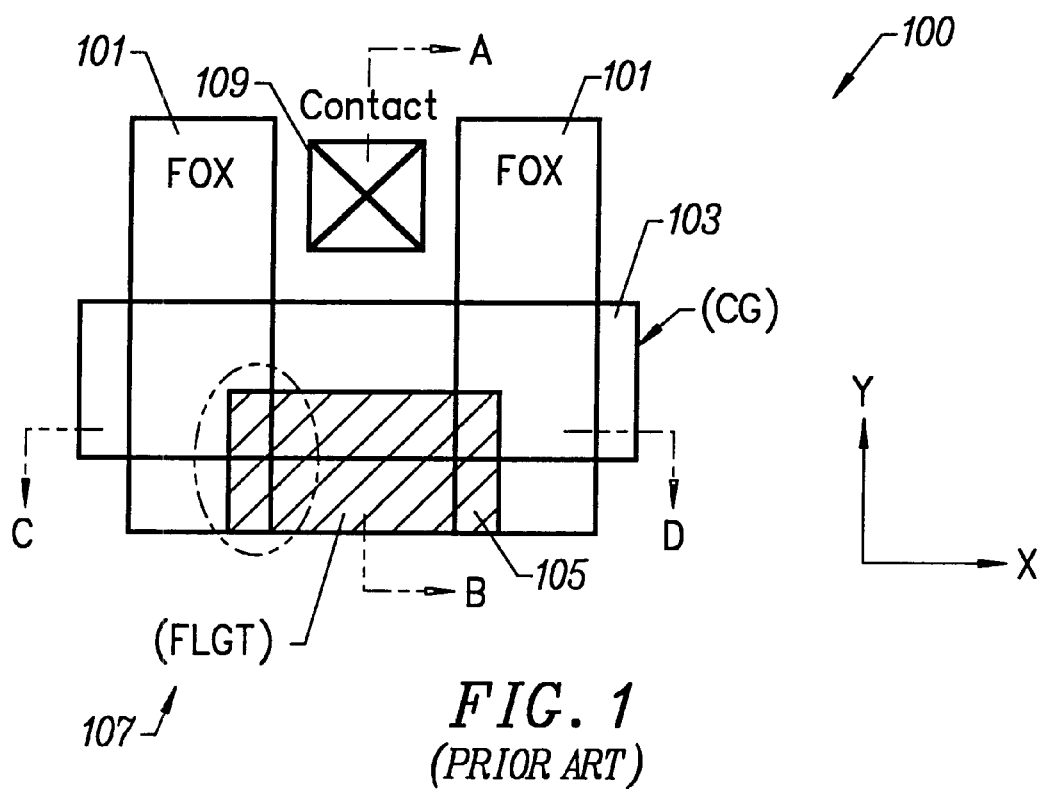
FIGS. 1–2 illustrate simplified diagrams of a conventional split gate flash memory cell.
Figure 2:
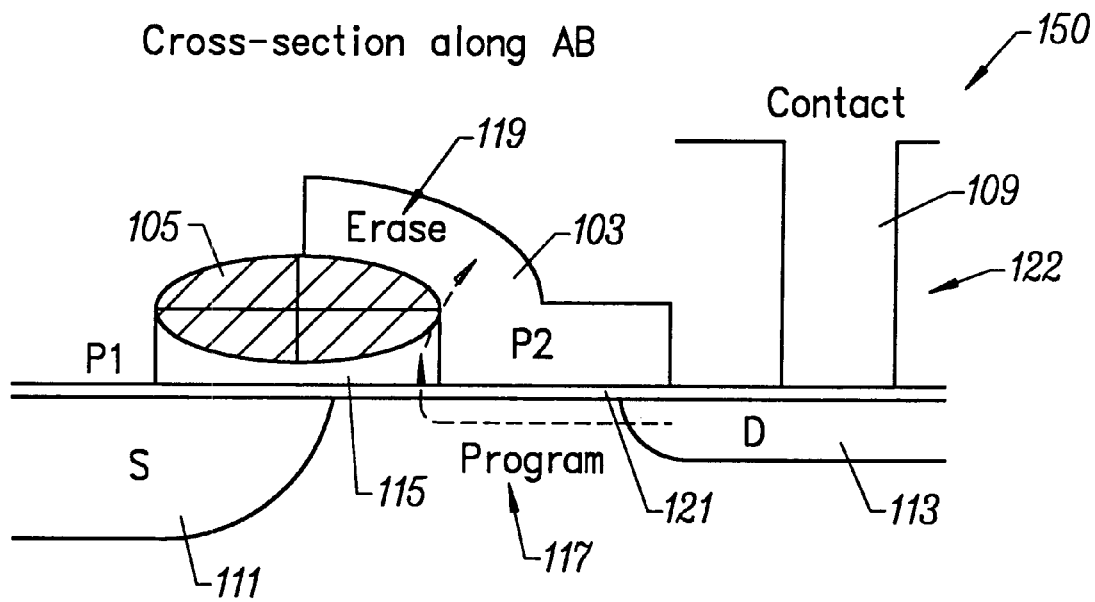

FIGS. 1 and 2 illustrate simplified diagrams of a conventional split gate flash memory cell. As shown, the diagrams include a top-view or plan view 100 and a side-view or cross-sectional view 150 of the conventional split gate flash memory cell. The top-view diagram 100 shows field isolation oxide region(s) 101, which is commonly termed the FOX region. The FOX region separates and/or isolates one cell region from another cell region in the active device region. A flash memory device is defined between the FOX regions. The flash memory device includes a variety of features such as a floating gate 105 that is defined between and overlaps a portion of the FOX regions. A control gate 103 is defined overlying a portion of the floating gate and is defined overlying portions 107 of the FOX regions. A contact 109 to a source/drain region is also shown. The floating gate is made using conventional patterning techniques that form the floating gate structure which overlaps 107 portions of the FOX regions. This conventional floating gate is not self-aligned, and leads to larger cell sizes.

The side-view diagram 150 is made along a cross-section shown along line A to B in FIG. 1. The side-view diagram 150 of the flash memory device includes a substrate 117, which is commonly a semiconductor or silicon substrate. A dielectric layer 121 is defined overlying the top surface of the substrate 117. The dielectric layer 121 is typically called the tunnel oxide layer. A floating gate 115 is defined on the tunnel oxide layer. Control gate layer 103 is defined overlying a portion of the floating gate layer 105 to form the "split" gate configuration. A transistor source region 111 is defined in the substrate underlying the tunnel oxide layer. A transistor drain region 113 is defined in the substrate underlying the tunnel oxide layer. The drain region 113 is also coupled to the control gate layer. The contact region is defined overlying the drain region. An inter-dielectric layer is defined overlying the transistor structures including portions of the control gate layer, the floating gate layer, FOX regions, and other transistor regions.

The above flash device is erased by Fowler-Nordheim tunneling of electrons. For example, selected voltages are applied to the $V_D$, $V_S$, and $V_{CG}$ to inject electrons through the edge of the floating gate to the control gate. The floating gate thereby becomes relatively more positively charged. This shifts the threshold voltage in the negative direction so that in the READ mode the transistor will be "on." In the program mode the control gate is at a high voltage while a fixed voltage is applied to the drain junction to generate hot electrons. These hot electrons have sufficient energy to overcome the oxide barrier and enter into the floating gate. The threshold voltage thereby shifts in the positive direction so that in the read mode the transistor will be "off." Typically, the erased state corresponds to a logical "1" stored in the cell, and the programmed state corresponds to a logical "0" stored in the cell. Of course, in particular implementations, the reverse notational convention can also be used such that an erased state corresponds to a logical "0" and a programmed state corresponds to a logical "1".

Numerous limitations exist in this conventional cell structure. In particular, conventional floating gate structures are often programmed for binary operation. That is, a first voltage level corresponds to a first state ("1") and a second voltage level corresponds to a second state ("0"). Accordingly, only two states can often be present in conventional devices. Additionally, conventional devices that have been indicated as possessing more than two programming states are severely limited. In particular, conventional programming techniques for providing more than two voltage levels on the floating gate are often time dependent and generally require complex algorithms and the like. Although some techniques have been developed for multi-state programming, these techniques are not generally efficient and/or cost effective. These and other benefits are described throughout the present specification and more particularly below.

Present Flash EEPROM Structures and Methods

Figure 3:
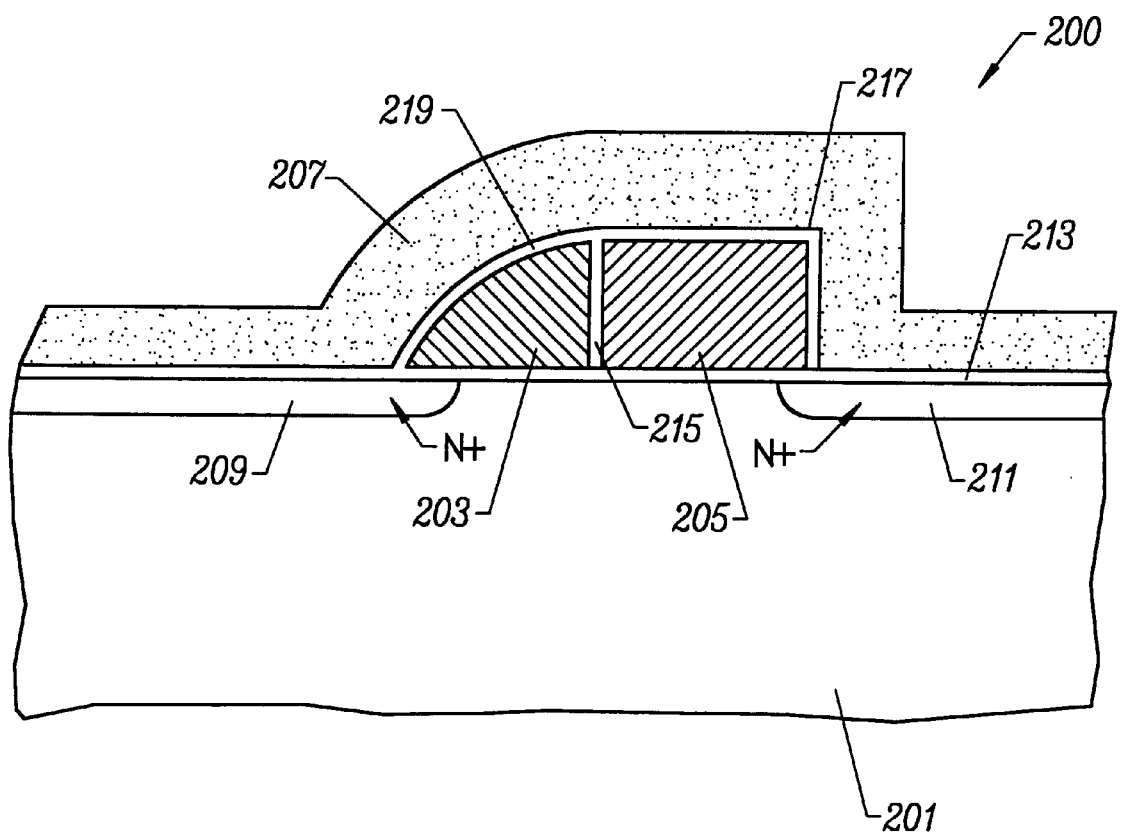
FIGS. 3 to 3C are simplified cross-sectional view diagrams of a multi-level flash memory cell according to embodiments of the present invention.

FIGS. 3 illustrates a simplified diagram of a flash memory cell 200 according to an embodiment of the present invention. This diagram is merely illustrations and should not limit the scope of the claims herein. One of ordinary skill in the art would recognize other variations, modifications, and alternatives. The side-view diagram shows substrate 201, which can be a silicon wafer or the like. In some embodiments, a well region or regions are defined in the substrate. Field isolation oxide regions, which are commonly termed the FOX regions (not shown), are also defined. The FOX region separates and/or isolates one cell region from another cell region in the active device region.

Flash memory device 200 is defined between the FOX regions. The flash memory device 200 includes a variety of features such as a floating gate 205 that is defined between a portion of the FOX regions. The floating gate is also defined overlying the substrate and in particular overlying dielectric layer 213. The dielectric layer 213 is typically called the gate oxide layer. In some embodiments, the gate oxide layer can be replaced by a nitride layer, a silicon oxynitride layer, and as others. In most embodiments, the dielectric layer is substantially free from pin holes and is substantially uniform.

A control gate 207 is defined overlying a portion of the floating gate. The control gate is defined overlying an oxide-on-nitride-on-oxide, which is commonly termed ONO, layer 217. The ONO layer is formed overlying a top surface of the floating gate and one side of the floating gate, as shown. The ONO layer is an interface which couples between the floating gate and the control gate.

A select gate 203 is defined adjacent to the floating gate, and underlying the control gate. The select gate is actually a sidewall spacer that is defined on an edge of the floating gate. Surrounding the select gate is oxide layer 219, which isolates and insulates the select gate from the control gate and the floating gate. Source/drain regions 209, 211 are also shown.

The device of FIG. 3 is merely one device in an array of flash memory cells. In most embodiments, a flash integrated circuit memory chip is made of literally millions of the above devices. In preferred embodiments, the flash memory integrated circuit has at least millions of cells, or more than billions of cells. The flash memory cells also can be integrated with a microprocessor in an embedded design as well as other designs. Of course, the particular design and number of cells used depends highly upon the application.

In a specific embodiment, the present device is programmed by way of selected voltages applied to the device elements. Programming occurs by way of a "hot electron" injection effect. It is believed that the electrons become hot at a boundary between a select gate and a floating gate, where a large voltage potential exists during programming. As merely an example, a sequence of selected voltages to perform functions on the device is shown in Table 1. This sequence is merely an illustration and should not limit the scope of the claims herein. One of ordinary skill in the art would recognize other variations, modifications, and alternatives.

TABLE 1

| | | Program Voltages | | |
|---|---|---|---|---|
| Mode\Voltage | $V_S$ (volt) | $V_{CG}$ (volt) | $V_D$ (volt) | $V_{SG}$ (volt) |
| Program | Grounded | Biased ($V_{CG1}$, $V_{CG2}$, $V_{CG3}$, $V_{CGn}$) | Floating or Reverse Biased | Biased Slightly Lower Than $V_{SGT}$ |

By way of the voltages above, electrons selectively move from the source region through a region underlying the select gate and inject through the dielectric layer into the floating gate. The present device selectively applies voltage, which is slightly less than a threshold voltage, to the select gate to allow a certain amount of electrons to traverse a substrate region underlying the select gate via a bipolar transistor-like process. That is, the region underlying the select gate does not invert, which is generally required for a field effect transistor, but is depleted. The region underlying the select gate merely allows electrons to diffuse from a higher concentration region in the first region to a lower concentration region underlying the floating gate. Once the electrons are underlying the floating gate, a hot electron injection technique traverses the electrons through the dielectric layer into the floating gate, which is positively biased to attract the electrons. Depending upon the level of voltage applied to the control gate, the floating gate is set to one of a plurality of distinct voltage levels. These distinct voltage levels provide for multi-level programming. That is, the floating gate has more than a binary state. As merely an example, the floating gate can be set to one of a plurality of voltages $V_{F1}$, $V_{F2}$, $V_{F3}$, $V_{F4}$, and others.

In a specific embodiment, the present programming process is more efficient than conventional techniques. Programming efficiency is governed by the following equation.

efficiency=gate current/channel current

As shown, larger values of efficiency generally relate to a larger gate current relative to a channel current. By way of a larger gate current, more electrons are being transferred to the floating gate, rather than through the channel to the drain region of the transistor. Larger efficiency values generally correspond to more efficient programming. In some embodiments, the present programming process is at least two orders of magnitude more efficient than conventional techniques, but is not limited.

Figure 3A:
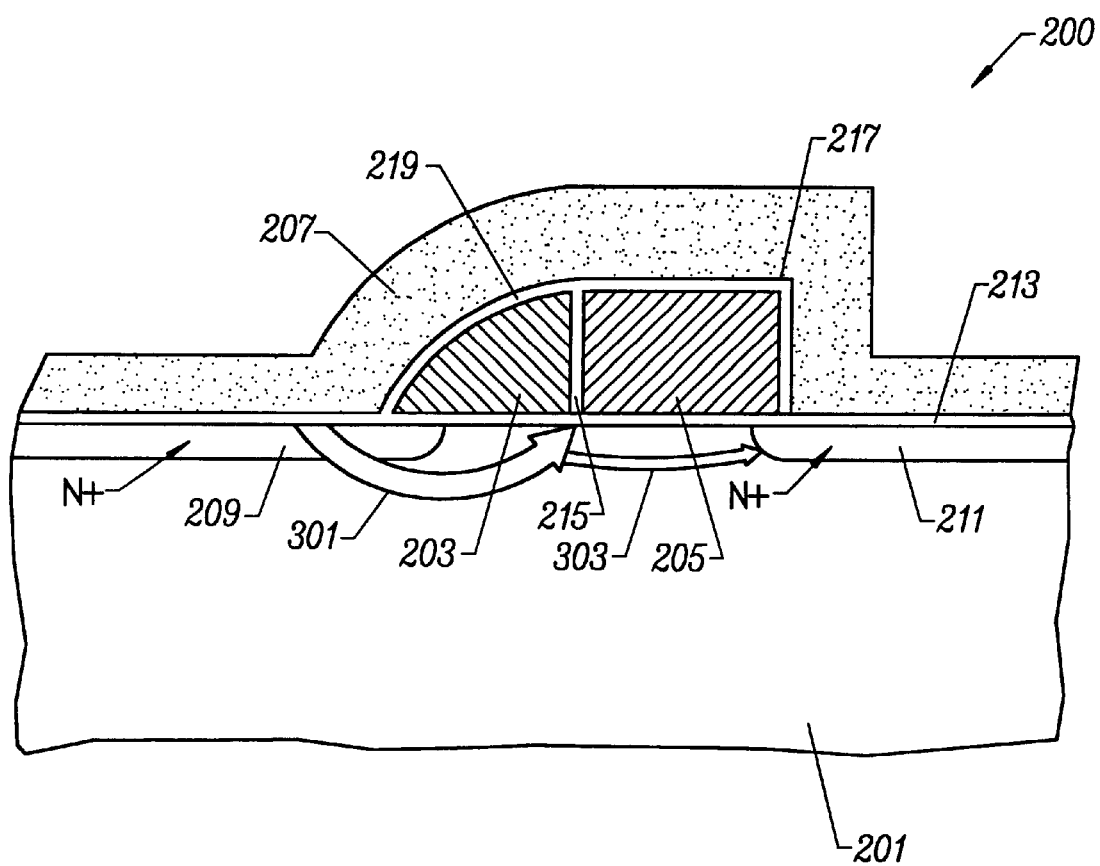

To understand the present programming process, FIG. 3A is provided and described. Electron flow has been illustrated with "arrows" with differing sizes. Here, a larger sized arrow generally corresponds to greater electron flow than a smaller sized arrow. As shown, a substantial portion of electrons flows from the source region of the device to the floating gate, which is illustrated by the large arrow. These electrons program the floating gate to one of a plurality of differing voltage levels. A much smaller portion of the electrons flow from the source region to the drain region, during programming. Accordingly, the present method of programming is much more efficient than conventional programming techniques, where only a small portion of the electrons actually inject into the floating gate and a much larger portion of the electrons pass through the channel region of the device.

Figure 3B:
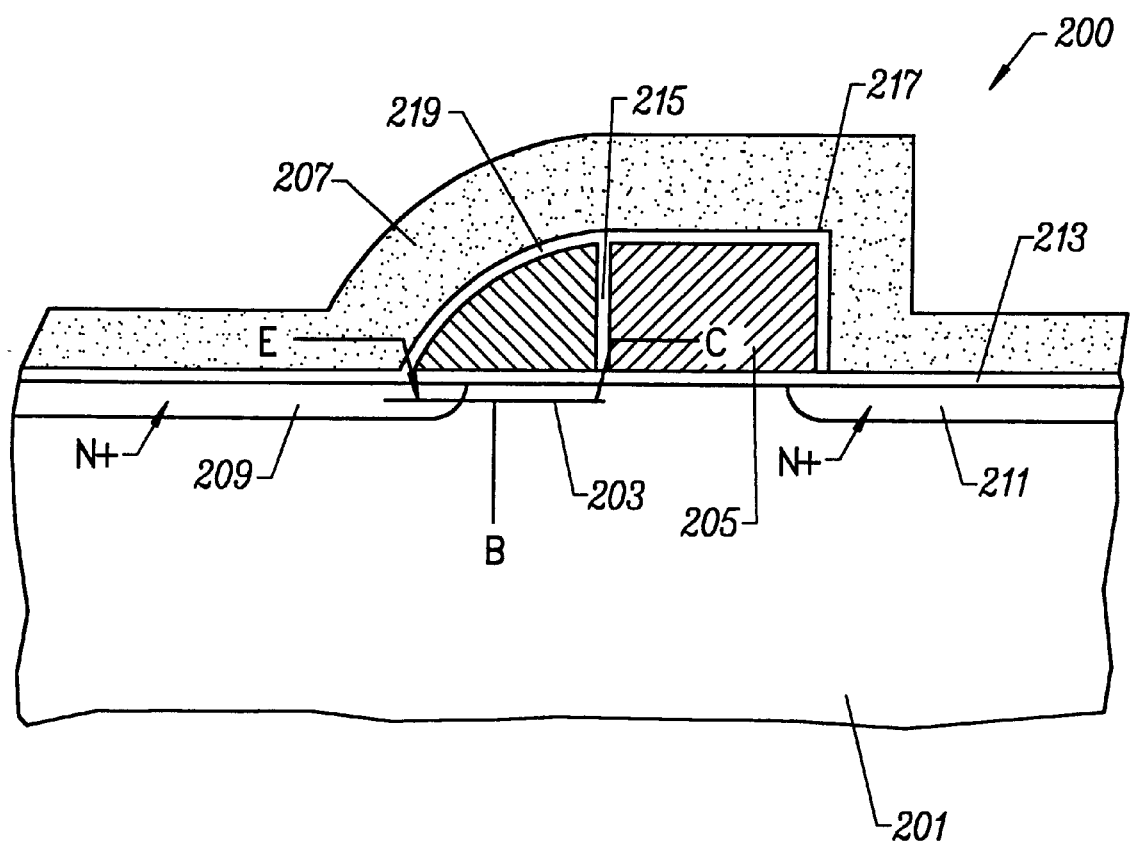

To further illustrate operation of the present programming process, FIG. 3B has been prepared. During programming, the present device operates similar to a bipolar transistor 307, which is shown in an active region of the present device. The "bipolar-like" transistor structure includes a base region B, an emitter region E, and a collector region C. These bipolar-like regions correspond to certain regions of the present device. For example, the base region corresponds to a region underlying the select gate. The emitter region corresponds to the source region, and the collector region corresponds to the floating gate region. During programming, a selected or "throttled" voltage level is applied to the select gate, which allows electrons from the source region (or emitter region) to pass through the region underlying the select gate. An electric field at a gap between and underlying the floating gate and the select gate accelerates the electrons through the dielectric layer into the floating gate. By way of the present programming process, little recombination of electrons takes place since the select gate length is often much smaller than a characteristic electron diffusion length. Once the desired quantity of electrons charge the floating gate, the present programming process is finished. In a preferred embodiment, the selected voltage applied to the control gate saturates the electrons on the floating gate to complete programming the floating gate. Accordingly, the programming process is generally not time dependent (although it has a transient state), but is based upon a saturation level of electrons, which is functionally related to the voltage applied to the control gate. By way of different selected voltages applied to the control gate, more than one voltage level can be applied to the floating gate for multi-voltage level operation, as shown in the simplified diagram of FIG. 3C, for example.

Figure 3C:
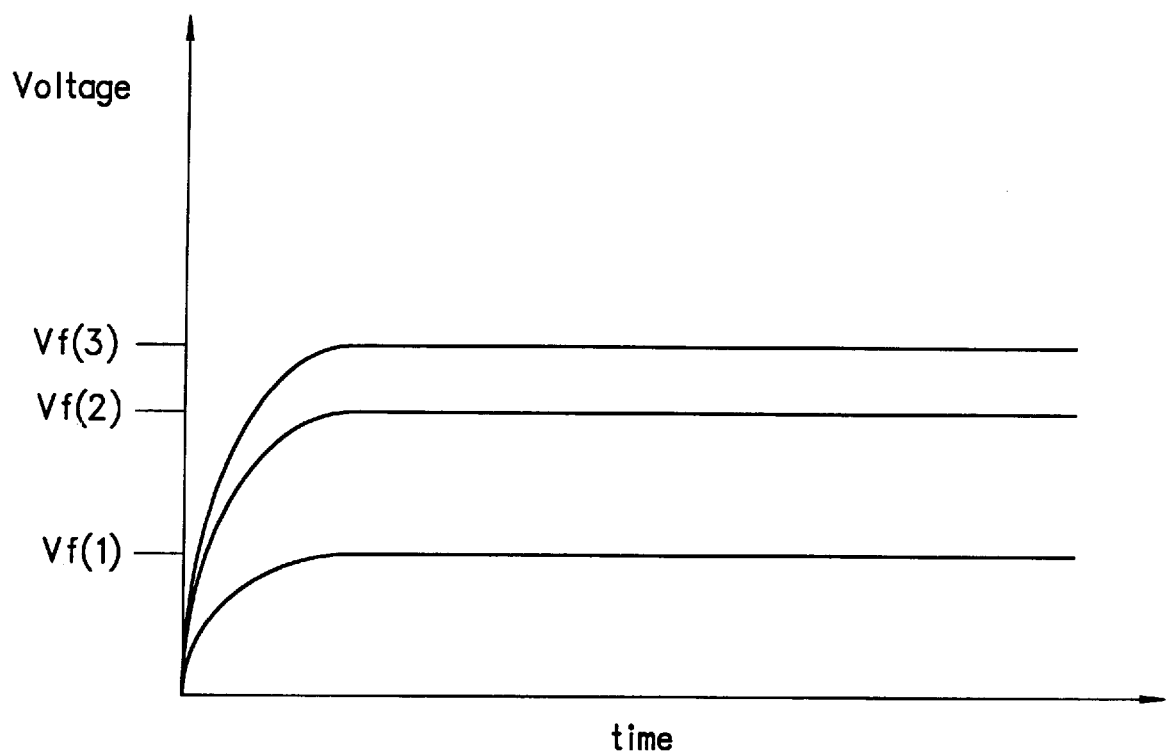
Figure 4:
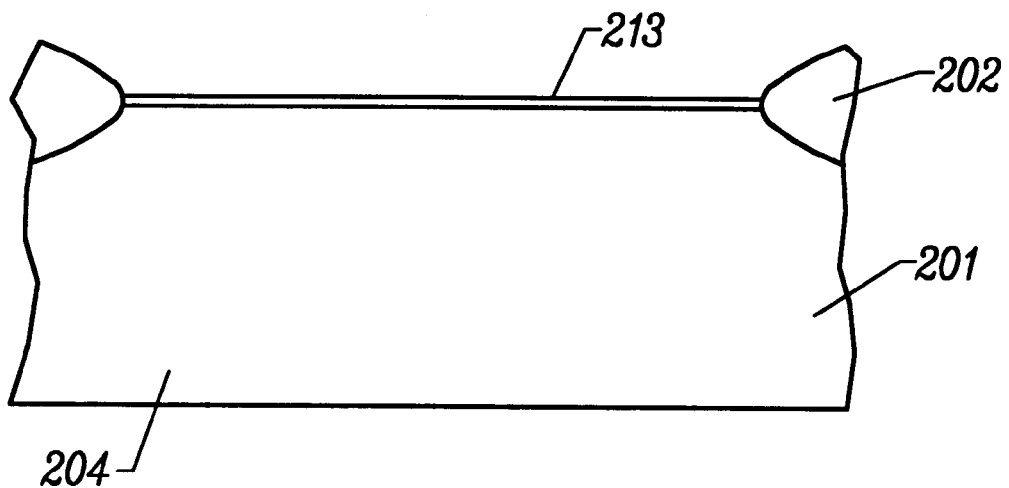
FIGS. 4–10 illustrate a method for fabricating a multi-level flash memory cell according to embodiments of the present invention.

FIG. 3C shows a plot of floating gate voltages with respect to time during a programming process according to the present invention. As shown, the vertical axis represents voltage (V). The horizontal axis represents time (t). One of many voltage levels can be coupled through the floating gate. As merely an example, a first voltage (e.g., $V_{CG1}$, $V_{CG2}$, $V_{CG3}$, $V_{CGn}$) is applied to the control gate, which is proportional to a final voltage level coupled through the floating gate. A selected voltage (slightly less than a threshold voltage needed to invert the region underlying the select gate) is applied to the select gate to allow electrons from the source region (which is grounded) to flow from the source region to a region underlying the select gate. Here, the region underlying the select gate is depleted, but not inverted. Additionally, the drain region can be floating or reverse biased, which can enhance programming speed in some embodiments. The electrons underlying the select gate accelerate through the channel region by way of an electron gradient and inject into the floating gate by way of an applied voltage to the control gate. The voltage level on the floating gate increases in, perhaps an exponential manner, until an asymptotic value is achieved. Additionally, a threshold level of the transistor including the floating gate increases as well. In some embodiments, programming time can often take about 1.0 millisecond and less, or 1.0 microsecond and less. Depending upon the voltage at the control gate, the asymptotic value can be at, for example, $V_{F1}$, $V_{F2}$ or $V_{F3}$. Once the floating gate becomes saturated with electrons, the floating gate is programmed. Accordingly, the present process easily sets the voltage level on the floating gate by a selected sequence of voltages applied to the various transistor structures.

In a specific embodiment, the present flash device is erased by Fowler-Nordheim tunneling of electrons. For example, selected voltages are applied to the $V_S$, $V_{CG}$, $V_{SG}$, and $V_D$ to inject electrons through the ONO layer defined on the floating gate to the select gate. The floating gate thereby becomes relatively more positively charged. As merely an example, a sequence of selected voltages to perform erase functions on the device is shown in Table 2. This sequence is merely an illustration and should not limit the scope of the claims herein. One of ordinary skill in the art would recognize other variations, modifications, and alternatives.

TABLE 2

Erase Voltages

| Mode\Voltage | $V_S$ (volt) | $V_{CG}$ (volt) | $V_D$ (volt) | $V_{SG}$ (volt) |
|---|---|---|---|---|
| Erase | Floating | Negative Bias | Floating | Positive Bias |

By way of the voltages above, electrons selectively move from the floating gate through the tunneling layer. These electrons traverse through the tunneling layer by way of a phenomenon known as Fowler-Nordheim tunneling. In a specific embodiment, a relatively large voltage bias is applied between the select gate and the floating gate to remove electrons from the floating gate. The relatively large bias is often greater than about 5–10 volts for a 0.5 micron sized design rule device on the control gate. In most embodiments, a number of cells or the entire cells are erased at once in the present flash cell design.

A method according to an embodiment of the present invention is briefly outlined as follows:
1. Provide semiconductor substrate;
2. Implant well regions (e.g., double, triple);
3. Grow field isolation oxide;
4. Grow tunnel oxide;
5. Form first polysilicon layer (poly-1);
6. Dope first polysilicon layer;
7. Form sacrificial nitride layer;
8. Pattern first polysilicon layer;
9. Grow tunnel oxide for erase;
10. Deposit second polysilicon layer (i.e., poly-2);
11. Spacer etch;
12. Mask spacer;
13. Remove one spacer on each gate;
14. Form thermal oxide;
15. Implant source/drain regions;
16. Deposit dielectric layer;
17. Form dielectric spacers;
18. Strip nitride;
19. Form oxide-on-nitride-on-oxide;
20. Deposit third polysilicon layer (poly-3);
21. Pattern third polysilicon layer;
22. Perform remaining steps.

The above sequence of steps shows a novel method of forming a flash memory cell according to the present invention. This sequence of steps provides numerous benefits such as a self-aligned select gate, as well as others. The steps are merely an illustration and should not limit the scope of the claims herein. One of ordinary skill in the art would recognize other variations, alternatives, and modifications. Details of the above steps are shown by way of the Figs. below.

FIGS. 4–10 illustrate a method for fabricating a flash memory cell according to embodiments of the present invention. These diagrams are merely illustrations and should not limit the scope of the claims herein. One of ordinary skill in the art would recognize other variations, modifications, and alternatives. Like reference numerals are used in these Figs. as some of the previous Figs. for easy cross-referencing. The present method begins by forming field isolation oxide regions 202 into a semiconductor substrate 201, which is commonly silicon, but can be other materials. The field isolation oxide regions 202 are formed using a local oxidation of silicon technique, which is better known as LOCOS, but can be other forms of LOCOS, as well as other isolation processes. Well regions 204 are defined in the semiconductor substrate. The well regions can be single, double, or triple wells, as well as others. Well regions are often made by way of implantation.

A tunnel dielectric layer 213 or dielectric layer is formed overlying the surface of the semiconductor substrate. In particular, the dielectric layer 213 is defined within the active region between isolation regions. The tunnel dielectric layer is often made of a high quality oxide layer such as thermal oxide or the like. The dielectric layer can also be made of multiple layers as well as silicon oxynitrides, silicon nitride, and other materials. The tunnel dielectric is often substantially pin hole free and high quality. Thermal oxidation or treatment methods are often used to manufacture the tunnel dielectric layer.

Figure 5:
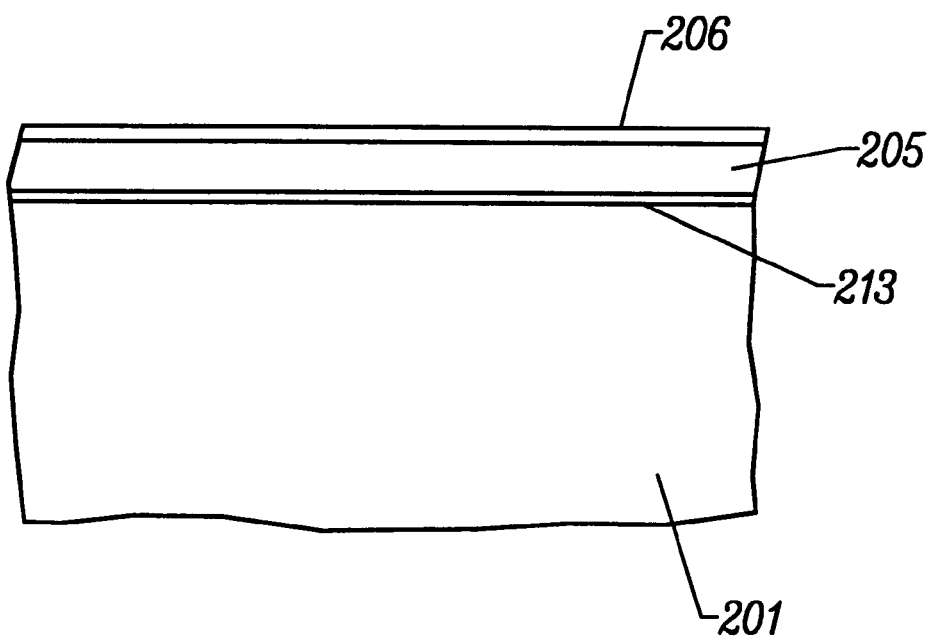

A first polysilicon layer 205 is formed overlying the tunnel dielectric layer 213, as shown in FIG. 5. As shown, the polysilicon layer 205, which is commonly called poly-1, has a relatively consistent thickness and rests overlying the tunnel dielectric layer. The polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCl_3$), in-situ doping (e.g., $PH_3$), and ion implantation.

Figure 6:
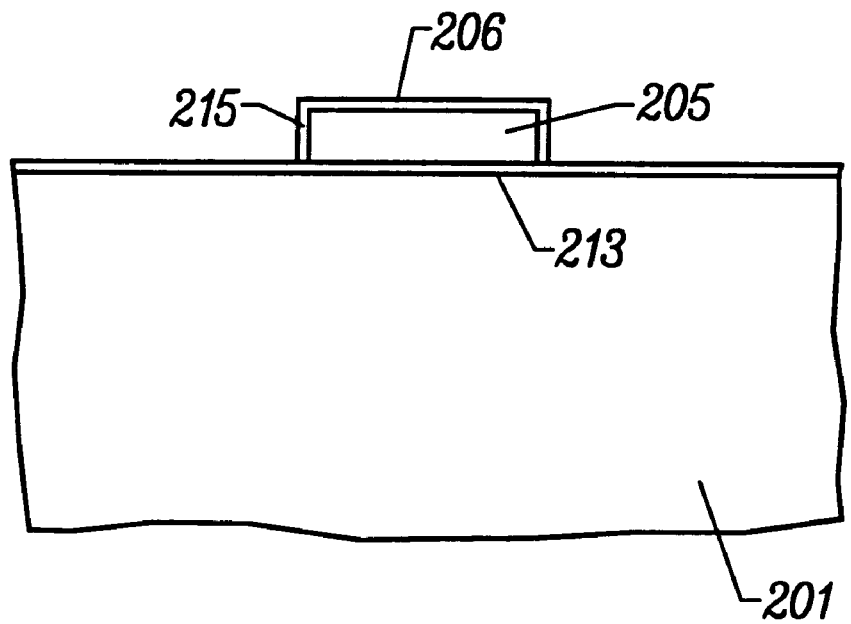

A layer of dielectric material 206 is defined overlying the polysilicon layer 205, as shown in FIG. 5. The dielectric material can be formed using a variety of techniques. In this embodiment, silicon nitride is patterned as a mark to have exposed regions. In a specific embodiment, the silicon nitride prevents oxidation of the poly-1 layer. An etching step then takes place to selectively remove a portion of the nitride layer and the polysilicon layer to define the floating gate structure, as shown in FIG. 6.

A dielectric layer 215 is defined overlying edges of the patterned first polysilicon layer 205. The dielectric layer insulates and isolates edges of the patterned first polysilicon layer from any overlying integrated circuit elements. The dielectric layer is commonly an oxide layer made by thermal oxidation or steam oxidation.

Figure 7:
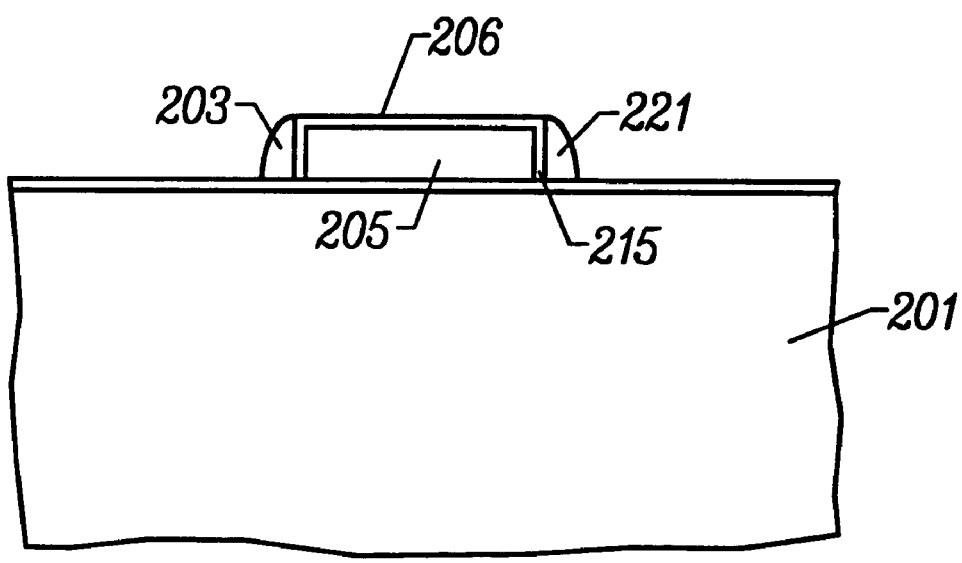

Sidewall spacers 203, 221, are defined on isolated edges of the patterned polysilicon layer or floating gate structure, as shown in FIG. 7. The spacers are made by forming a second polysilicon layer (or poly-2) defined overlying the dielectric layer 215. The second polysilicon layer is often a thickness of material deposited using a variety of techniques. En some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCL_3$), in-situ doping (e.g., $PH_3$), and ion implantation. Preferably, the second polysilicon layer is heavily doped to form a substantially conductive material layer. The second polysilicon layer is etched using a reactive ion etching process that substantially removes horizontal portions of the polysilicon layer, while leaving vertical portions of the polysilicon layer intact. The vertical portions of the polysilicon layer define the sidewall spacers in the Fig. The reactive ion etching process is substantially anisotropic in nature and can be performed without a masking layer. In other embodiments, the reactive ion etching process occurs in a selected manner using a masking layer for other portions of the device.

Figure 8:
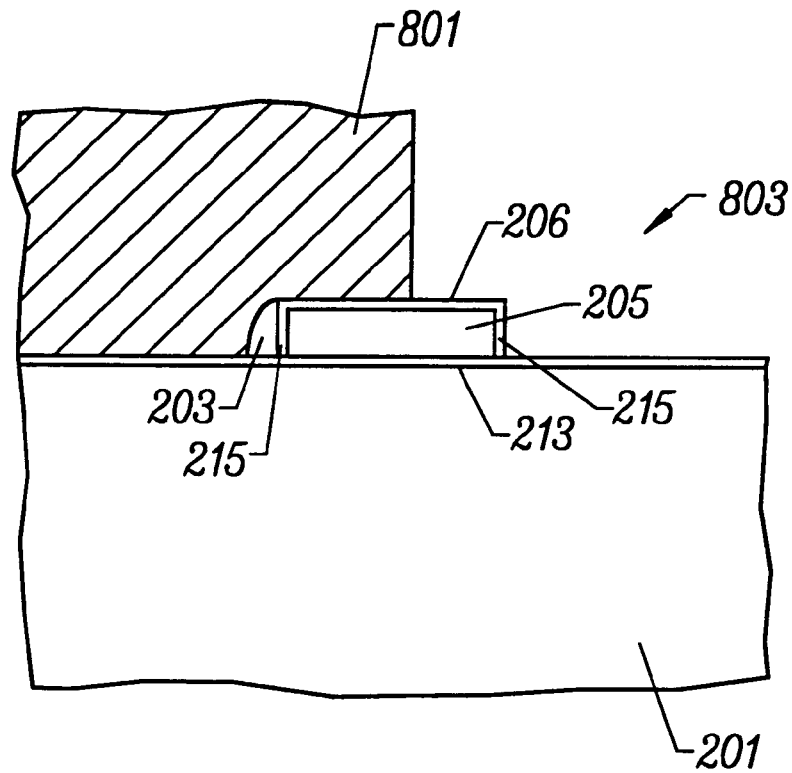

A mask layer 801 is deposited overlying portions of the first polysilicon layer and one of the sidewall spacers 203, as shown in FIG. 8. The mask layer can be any suitable photo masking layer. The photo masking layer is often made by way of a step of applying a photo lithographic material overlying surfaces of the substrate. This step is followed by exposing the material, and then developing the material to form exposed region of the substrate 803. The exposed region is selectively etched to remove the sidewall spacer 221 while substantially leaving portions of the substrate and the first polysilicon layer intact. The masking layer is stripped using conventional techniques.

Figure 9:
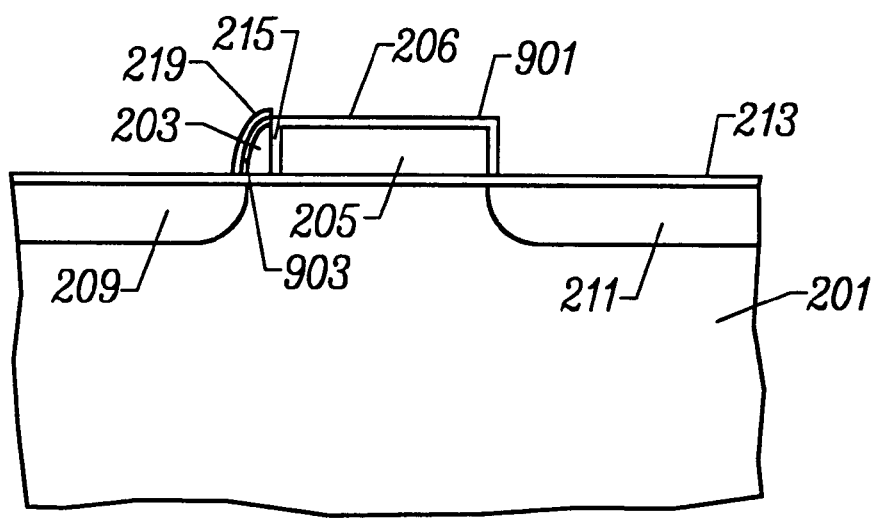
Figure 10:
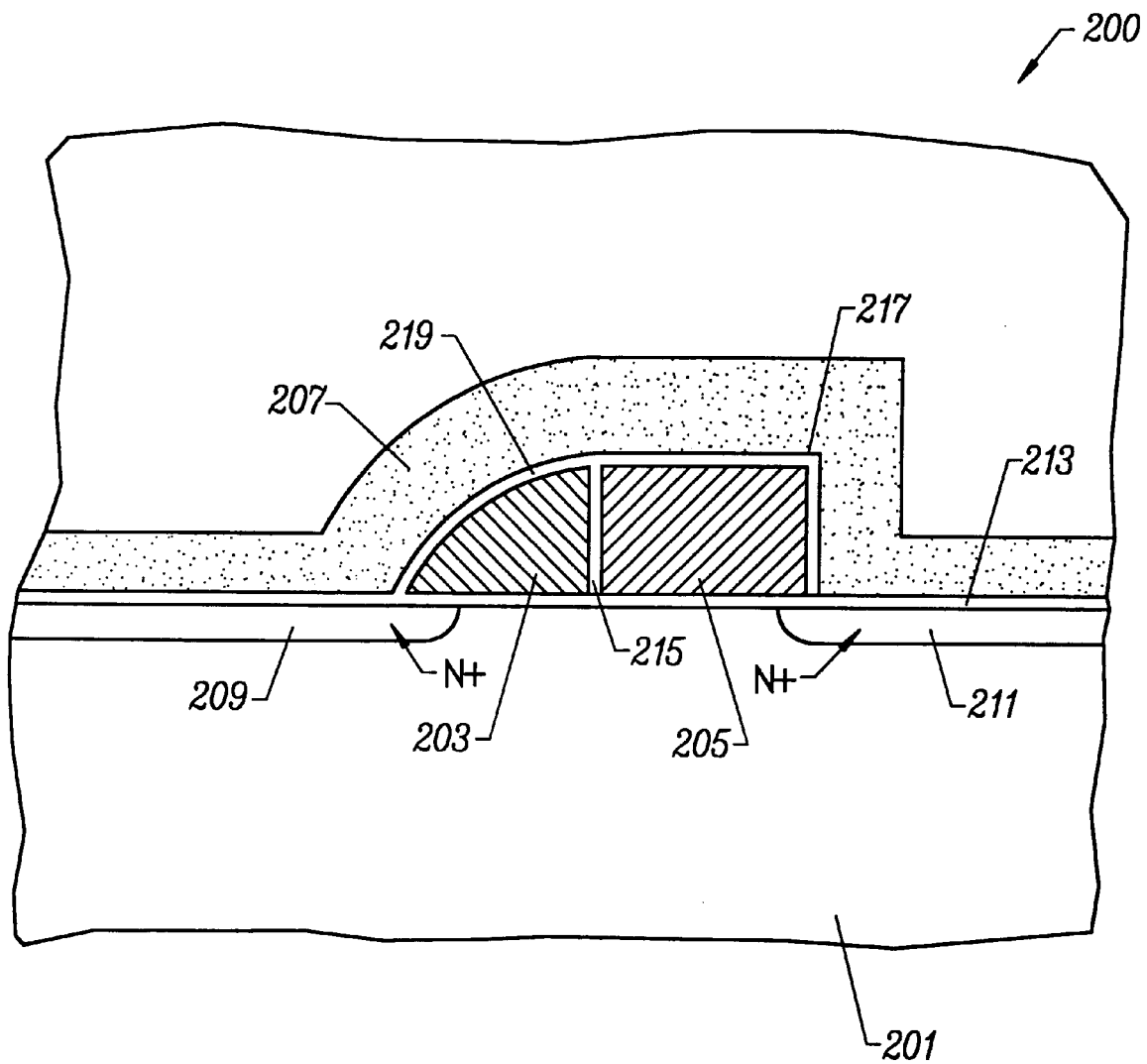

A thermal oxide layer 219 is formed overlying exposed portions of the first and second polysilicon layers, as shown in FIG. 9. In particular, the thermal oxide layer 219 is formed overlying the outside or exposed portion of the spacer 203. The thermal oxide does not form substantially overlying the top surface 901 of poly-1, which is still covered with silicon nitride 206. The thermal oxide layer insulates and isolates any exposed portions of the first and second polysilicon layers from any overlying circuit elements. A thicker oxide layer 903 made of chemical vapor deposition is then formed overlying the thermal oxide layer to form a spacer 219. The combination of these layers also act as a mask for a subsequent etching step of poly-1 and poly-3. A selective etching step removes nitride layer 206 from the top surface of poly-1. In one embodiment, the selective etching step is a wet etching technique that uses a hot phosphoric acid bearing compound or the like.

In a specific embodiment, the implanting step defines source/drain regions 209, 211 in the flash memory device. The implanting step often introduces N-type impurities into the substrate 201. The N-type impurities can be introduced through the dielectric material 213, which can act as a screen. In a specific embodiment, the implanting step occurs after removing maksing layer 801.

Ah oxide-on-nitride-on-oxide 217, which is commonly termed ONO, is deposited on exposed portions of the floating gate structure and exposed portion of the spacer. In particular, an oxide layer is defined overlying the first polysilicon layer. In a specific embodiment, the present invention uses a furnace oxidation process that relies upon steam oxidation to form a dielectric layer such as an oxide layer. A thin nitride layer is deposited overlying the oxide layer. A subsequent oxide layer can be grown overlying the nitride layer by oxidizing the nitride. The combination of the oxide/nitride/oxide is commonly termed ONO. Of course, the type of dielectric layer used depends upon the application.

A third polysilicon layer or control gate layer (poly-3) is defined overlying the surface of the structure. The third polysilicon layer is often a thickness of material deposited using a variety of techniques. In some embodiments, the polysilicon layer is defined at low temperature in an amorphous state, which is later crystallized. Alternatively, the polysilicon layer is formed in the polycrystalline state. The polysilicon layer can be doped using diffusion (e.g., $POCL_3$), in-situ doping (e.g., $PH_3$), and ion implantation. The third polysilicon layer is defined using masking and etching steps to form a control gate layer 207.

Control gate layer 207 is defined overlying a portion of the floating gate layer and a portion of the sidewall spacer. In a specific embodiment, etching defines the first polysilicon layer to separate the floating gates from each other to form each cell. The first polysilicon layer can be etched during the same etching step as the third polysilicon layer. In most embodiments, the second polysilicon layer or select gates are masked by way of dielectric layers including oxide. The combination of these steps form the individual flash memory cells.

An inter-dielectric layer (not shown) is defined overlying the transistor structures including portions of the control gate layer, the floating gate layer, FOX regions, and other transistor regions. The inter-dielectric layer can be made of a variety of materials such as borophosphosilicate glass ("BPSG"), phosphosilicate glass ("PSG"), CVD oxide, fluorinated glass ("FSG"), as well as other dielectric layers.

While the above is a full description of the specific embodiments, various modifications, alternative constructions and equivalents may be used. For example, specific dimensions are discussed above for the specific embodiments. But of course, these dimensions may depend on the particular application. Therefore, the above description and illustrations should not be taken as limiting the scope of the present invention which is defined by the appended claims.

What is claimed is:

1. A method of programming a flash memory device, said method comprising:

applying a voltage that is less than a threshold voltage to a select gate of a flash memory device; and transferring electrons from a first region through a second region underlying said select gate to a channel region underlying a floating gate;

wherein said transferring step occurs using an electron gradient from a higher concentration region in said second region to a lower concentration region in said channel region.

2. The method of claim 1 further comprising a step of transferring said electrons from said channel region to said floating gate to charge said floating gate to one of a plurality of voltage levels.

3. The method of claim 1 further comprising a step of applying a voltage to said floating gate to create an electric field between said channel region and said floating gate, said electric field causing electrons to inject into said floating gate.

4. The method of claim 1 wherein said floating gate is provided with one of a plurality of voltages $V_{F1}$, $V_{F2}$, $V_{F3}$, and $V_{F4}$.

5. The method of claim 1 wherein said select gate comprises polysilicon.

6. The method of claim 1 wherein said select gate is a sidewall spacer defined on an edge of said floating gate.

7. The method of claim 6 further comprising an insulating layer defined on said edge, said insulating layer isolating said floating gate from said select gate.

* * * * *